United States Patent
Zheng et al.

(10) Patent No.: US 11,201,083 B2
(45) Date of Patent: Dec. 14, 2021

(54) METHODS FOR FORMING MEMORY DEVICES, AND ASSOCIATED DEVICES AND SYSTEMS

(71) Applicant: Micron Technology, Inc., Boise, ID (US)

(72) Inventors: Jukuan Zheng, Boise, ID (US); Sri Sai Sivakumar Vegunta, Boise, ID (US); Kevin L. Baker, Boise, ID (US); Josiah Jebaraj Johnley Muthuraj, Meridian, ID (US); Efe S. Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 61 days.

(21) Appl. No.: 16/780,594

(22) Filed: Feb. 3, 2020

(65) Prior Publication Data
US 2021/0202299 A1 Jul. 1, 2021

Related U.S. Application Data

(60) Provisional application No. 62/955,927, filed on Dec. 31, 2019.

(51) Int. Cl.
| | |
|---|---|
| *H01L 21/768* | (2006.01) |
| *H01L 27/24* | (2006.01) |
| *H01L 27/108* | (2006.01) |
| *H01L 21/67* | (2006.01) |
| *H01L 45/00* | (2006.01) |
| *G11C 5/06* | (2006.01) |

(52) U.S. Cl.
CPC ............ *H01L 21/7684* (2013.01); *G11C 5/06* (2013.01); *H01L 21/67075* (2013.01); *H01L 27/10894* (2013.01); *H01L 27/24* (2013.01); *H01L 45/12* (2013.01); *H01L 45/141* (2013.01); *H01L 45/145* (2013.01)

(58) Field of Classification Search
None
See application file for complete search history.

(56) References Cited

U.S. PATENT DOCUMENTS

| | | | |
|---|---|---|---|
| 2010/0091558 A1* | 4/2010 | Lee | G11C 13/0014 365/163 |
| 2010/0117049 A1* | 5/2010 | Lung | H01L 45/142 257/4 |
| 2011/0233505 A1* | 9/2011 | Nitta | H01L 45/1253 257/3 |
| 2018/0350879 A1* | 12/2018 | Sel | H01L 23/5226 |
| 2021/0066587 A1* | 3/2021 | Trinh | H01L 45/1608 |

* cited by examiner

*Primary Examiner* — Evren Seven
(74) *Attorney, Agent, or Firm* — Perkins Coie LLP

(57) ABSTRACT

Methods of manufacturing memory devices having memory cells and corresponding selectors, and associated systems and devices, are disclosed herein. In one embodiment, a method of manufacturing a memory device includes (a) removing a protection layer formed over the memory cells and (b) forming a cap layer over the memory cells before forming a conductive via through the memory device. The cap layer is configured to protect the memory cells during operation and can comprise a resistive material. The protection layer can be more efficiently removed with improved process margin and less device health impact using a polishing process before the conductive via is formed, thus increasing the manufacturing margin of the memory device.

11 Claims, 14 Drawing Sheets

METHODS FOR FORMING MEMORY DEVICES, AND ASSOCIATED DEVICES AND SYSTEMS

CROSS-REFERENCE TO RELATED APPLICATION(S)

This application claims the benefit of U.S. Provisional Application No. 62/955,927, filed Dec. 31, 2019; which is incorporated herein by reference in its entirety.

TECHNICAL FIELD

The present technology generally relates to memory devices and methods for manufacturing memory devices, and more particularly relates to methods including forming a protective cap layer of resistive material over a memory device and optionally polishing the cap layer to improve a processing window by improving wet-etch efficiency, lessening conductive via protrusion, etc.

BACKGROUND

Memory devices are widely used to store information related to various electronic devices such as computers, wireless communication devices, cameras, digital displays, and the like. Information is stored by programing different states of a memory cell. Various types of memory devices exist, such as non-volatile memory devices (e.g., NAND Flash memory devices) and volatile memory devices (e.g., dynamic RAM (DRAM), synchronous dynamic RAM (SDRAM), etc.).

Improving memory devices, generally, may include increasing memory cell density, increasing read/write speeds or otherwise reducing operational latency, increasing reliability, increasing data retention, reducing power consumption, or reducing manufacturing costs, among other metrics. One way of reducing manufacturing costs is to improve manufacturing processes to increase the margin of successfully manufactured devices. Manufacturers can improve the manufacturing margin by implementing processes that, for example, increase the consistency or tolerance off manufacturing steps (e.g., removal or deposition of materials), improve the scale of manufacturing, etc.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
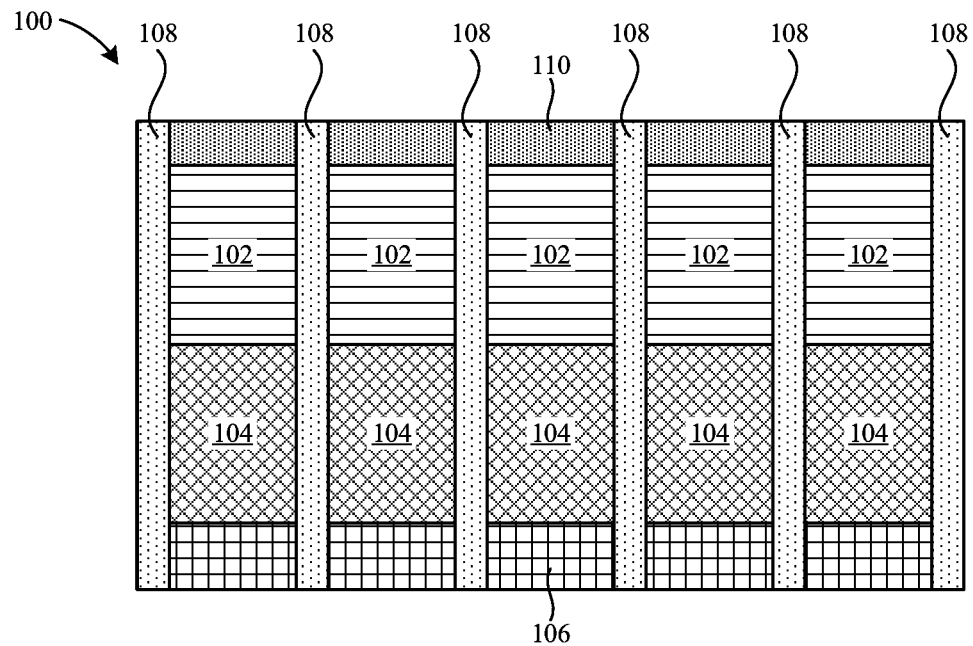
FIGS. 1A-1G are enlarged side cross-sectional views illustrating various stages in a method of manufacturing a memory device in accordance with embodiments of the present technology.

Specific details of several embodiments of memory devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A-4.

Embodiments of the present technology include methods of manufacturing memory devices having memory cells and corresponding selectors, and associated devices and systems. In several of the embodiments described below, for example, a method of manufacturing a memory device includes removing a protection layer formed over the memory cells, forming a cap layer over the memory cells, planarizing the cap layer, and depositing a first insulative material over the cap layer. The method can further include forming a socket in the memory device, depositing a second insulative material into the socket, and forming a conductive via through the second insulative material. The method can further include polishing the first and second insulative materials to remove a portion of the second insulative material. In one aspect of the present technology, the residual first insulative layer can be more efficiently removed using a wet-etching process and then a metallization layer formed over the cap layer and the conductive via, thus increasing the manufacturing margin of the memory device.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-4. For example, some details of memory devices well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIGS. 1A-1G are enlarged side cross-sectional views illustrating various stages in a method of manufacturing a memory device 100 (e.g., a semiconductor device) in accordance with embodiments of the present technology. Generally, the memory device 100 can be manufactured, for example, as a discrete device or as part of a larger wafer or panel. In wafer-level or panel-level manufacturing, a larger structure is formed before being singulated to form a plurality of individual structures. For ease of explanation and understanding, FIGS. 1A-1G illustrate the fabrication of a portion of a single memory device 100. However, one skilled in the art will readily understand that the fabrication of the memory device 100 can be scaled to the wafer and/or panel level—that is, to include many more components so as to be capable of being singulated into two or more memory devices—while including similar features and using similar processes as described herein.

FIG. 1A illustrates the memory device 100 after the formation of memory cells 102, selectors 104, and a first metallization layer 106. In the illustrated embodiment, individual ones of the memory cells 102 are operably (e.g., electrically) coupled to (i) corresponding ones of the selectors 104 and (ii) the first metallization layer 106. Electrically-coupled pairs of the memory cells 102 and the selectors 104 can be arranged in columns (e.g., with the memory cells 102 stacked over the selectors 104) that are separated by electrically insulative columns 108. In some embodiments, the memory cells 102 and/or the selectors 104 can comprise one or more chalcogenide materials. In some embodiments, the selectors 104 can be omitted and the memory cells 102 can be self-selecting. For example, the memory cells 102 can each comprise a chalcogenide element configured as both a memory storage element and a selection element. Accordingly, in such embodiments the memory cells 102 can be arranged in columns over the first metallization layer 106 and separated by the insulative columns 108. The first metallization layer 106 can comprise a metal such as tungsten, a metal alloy, a conductive-metal containing material, etc. The insulative columns 108 can comprise an oxide material, a dielectric material, a nitride material, etc.

In the illustrated embodiment, the memory device 100 further includes a protection layer 110 over the memory cells 102. The protection layer 110 is configured to protect the memory cells 102 during downstream manufacturing stages and, as described in detail below, can be a sacrificial layer. In some embodiments, the insulative columns 108 and the protection layer 110 can be formed of different materials. For example, the insulative columns 108 can be formed of an oxide material and the protection layer 110 can formed of a nitride material such as silicon nitride (SiN). Accordingly, the insulative columns 108 (e.g., upper end portions of the insulative columns 108) can project at least partially into the protection layer 110. In other embodiments, the insulative columns 108 and the protection layer 110 can be formed of the same material.

Figure 1B:
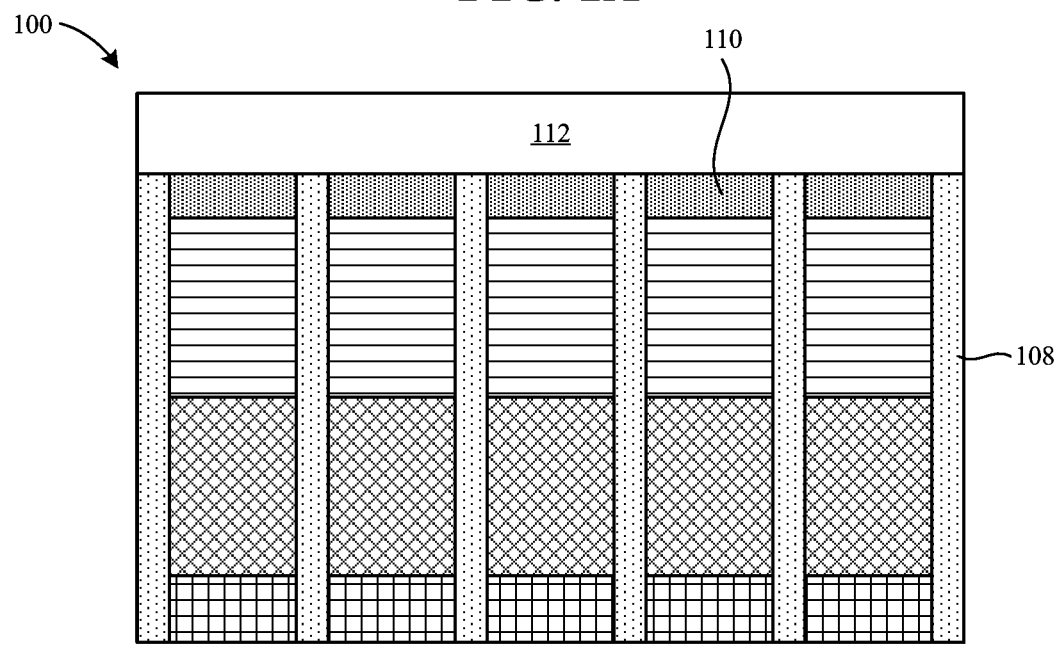

FIG. 1B illustrates the memory device 100 after formation/deposition of a first cap layer 112 over the protection layer 110 and the upper end portions of the insulative columns 108. In some embodiments, the first cap layer 112 can be formed of a nitride material and can have a thickness of between about 100-500 angstroms (e.g., about 250 angstroms).

Figure 1C:
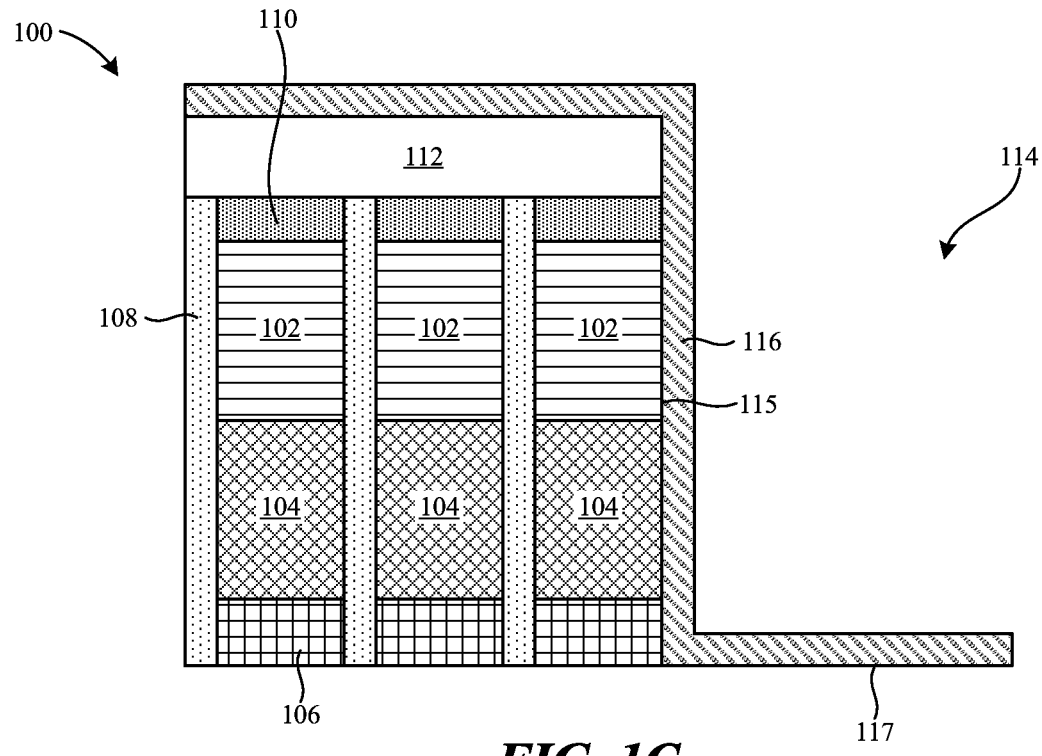

FIG. 1C illustrates the memory device 100 after formation of a socket 114 and a liner layer 116. The socket 114 can be formed by removing a portion of the memory device 100—such as one or more of the memory cells 102, the selectors 104, the first metallization layer 106, the insulative columns 108, the protection layer 110, and the first cap layer 112. In some embodiments, the socket 114 can include a generally vertical sidewall 115 formed, in part, by one of the vertically aligned pairs of the memory cells 102 and the selectors 104. The socket 114 can be formed via a mask and etching process, or another suitable removal process. The liner layer 116 can be formed along/over/on (i) a bottom surface 117 of the memory device 100 (which can comprise a portion of a temporary carrier wafer), (ii) the sidewall 115, and (iii) the first cap layer 112 (e.g., over an upper surface of the first cap layer 112). In some embodiments, the liner layer 116 can be formed of a nitride material and can have a thickness of between about 10-100 angstroms (e.g., about 60 angstroms). Although one socket 114 is illustrated in FIG. 1C, the memory device 100 can include two or more (e.g., many) sockets formed across the memory device 100.

Figure 1D:
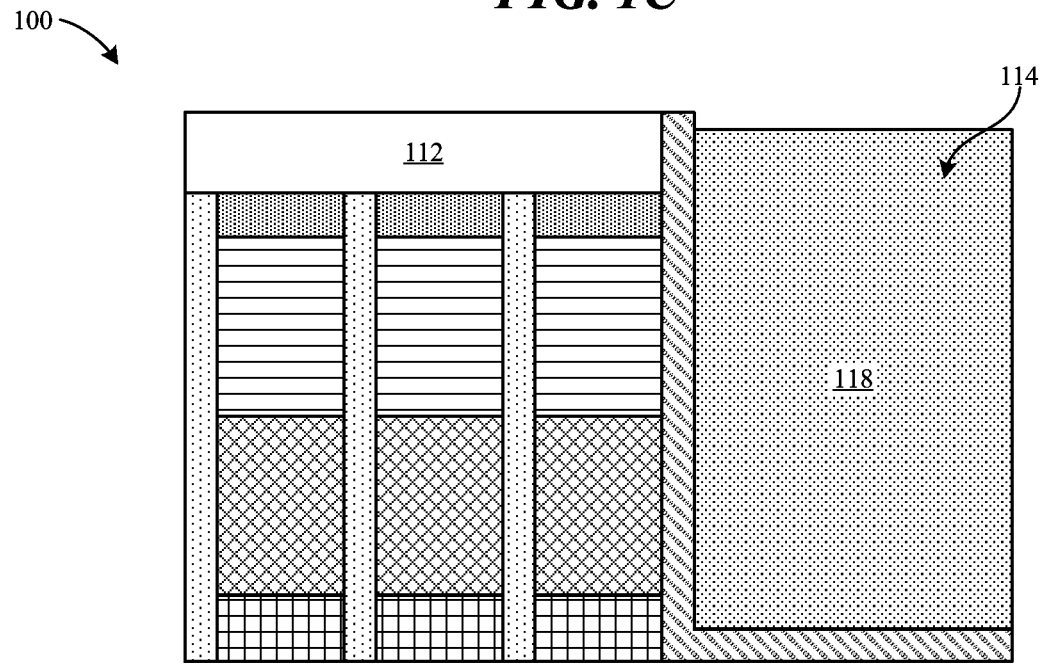

FIG. 1D illustrates the memory device 100 after (i) deposition of an insulative material 118 in the socket 114 and (ii) planarization/polishing of the upper surface of the memory device 100. The planarization can remove any excess insulative material 118 and also remove the portion of the liner layer 116 above the first cap layer 112. The insulative material 118 can be a passivation, dielectric, or other suitable insulating material such as, for example, silicon oxide, tetraethyl orthosilicate (TEOS), etc. In a particular embodiment, the insulative material 118 is TEOS. The memory device 100 can be planarized/polished using plasma etching, wet etching, chemical-mechanical planarization (CMP), buffing, and/or other suitable techniques. In a particular embodiment, the memory device 100 is planarized using a CMP process. In some embodiments, the planarization process can remove a larger thickness of the insulative material 118 than the first cap layer 112 (or vis versa) such that the upper surfaces of the insulative material 118 and the first cap layer 112 are nonplanar (e.g., positioned at different elevations).

Figure 1E:
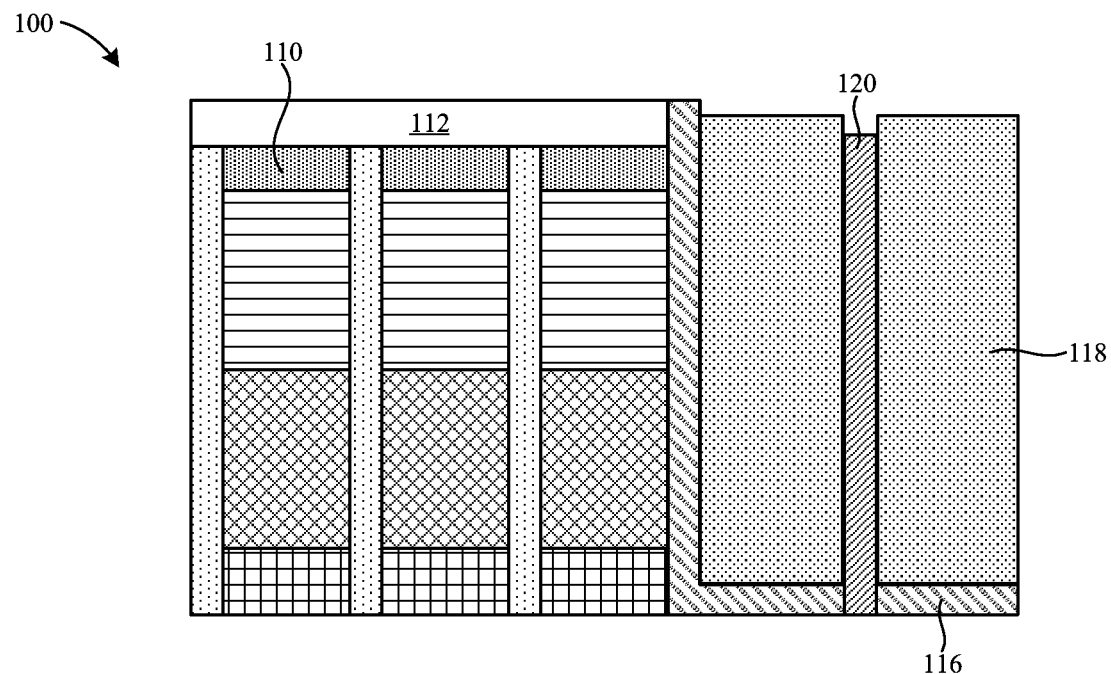

FIG. 1E illustrates the memory device 100 after (i) formation of a conductive via 120 through the insulative material 118 and the liner layer 116 and (ii) planarization/polishing of the upper surface of the memory device 100 to remove any excess material used to form the conductive via 120. In some embodiments, the conductive via 120 is formed by a suitable masking, etching, and deposition process. For example, a photolithography and/or etching process can be used to etch a high-aspect ratio hole through the insulative material 118, and then conductive material can be deposited into the hole to form the conductive via 120 using chemical vapor deposition, physical vapor deposition, atomic layer deposition, spin coating, electroplating, electroless plating, and/or another suitable technique. In some embodiments, the first cap layer 112 can have a thickness of between about 50-300 angstroms (e.g., about 150 angstroms) after planarization. Although a single conductive via 120 is shown in FIG. 1E, any number of conductive vias (e.g., two or more) can be formed through the socket 114.

Figure 1F:
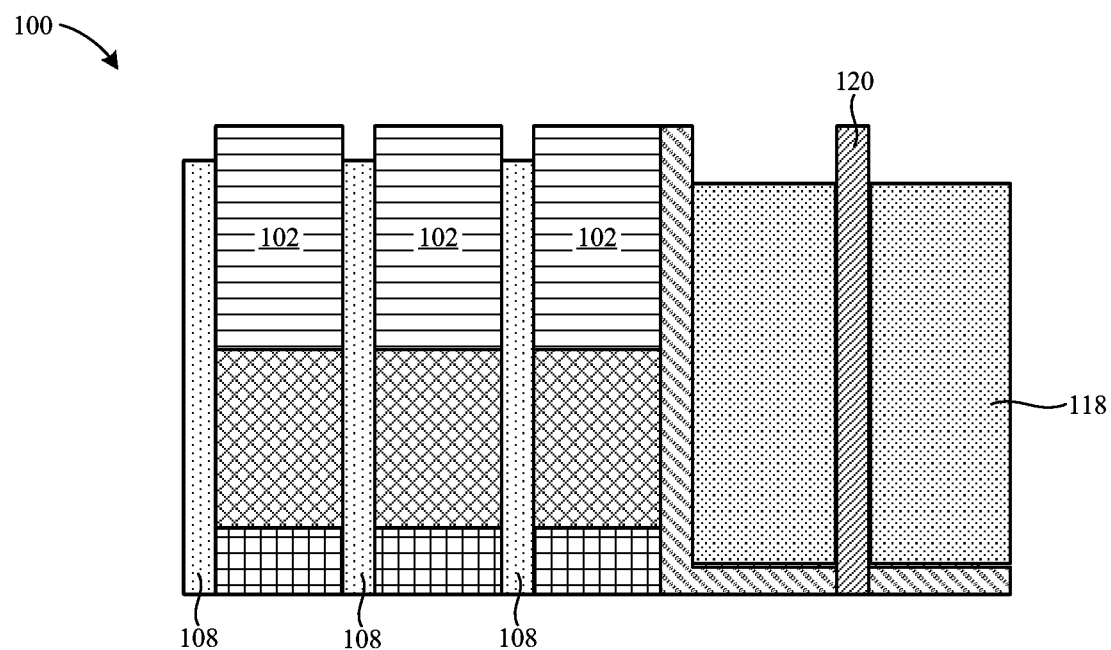

FIG. 1F illustrates the memory device 100 after removal of the first cap layer 112 and the protection layer 110 (FIG. 1E). In some embodiments, a wet-etching process can be used to remove the first cap layer 112 and the protection layer 110. In some embodiments, the wet-etching or other removal process can also remove a portion of the insulative material 118 such that the conductive via 120 (e.g., an upper portion of the conductive via 120) protrudes from the insulative material 118 (e.g., extends past an upper surface of the insulative material 118). Similarly, the removal process can also remove a portion of the insulative columns 108 such that the memory cells 102 (e.g., upper portions of the memory cells 102) extend to a higher elevation than the insulative columns 108 (e.g., extend past upper surfaces of the insulative columns 108). In some embodiments, however, it can be difficult to fully remove the protection layer 110 without also removing a large portion of the insulative columns 108 and the insulative material 118. For example, it can be difficult to fully remove the insulative material 118 without over polishing the memory device 100. This can cause the memory device 100 to have an upper surface with a generally variable topography (e.g., a relatively great line width) as shown in FIG. 1F. That is, the elevations of the memory cells 102, the insulative columns 108, the insulative material 118, and/or the conductive via 120 can vary.

Figure 1G:
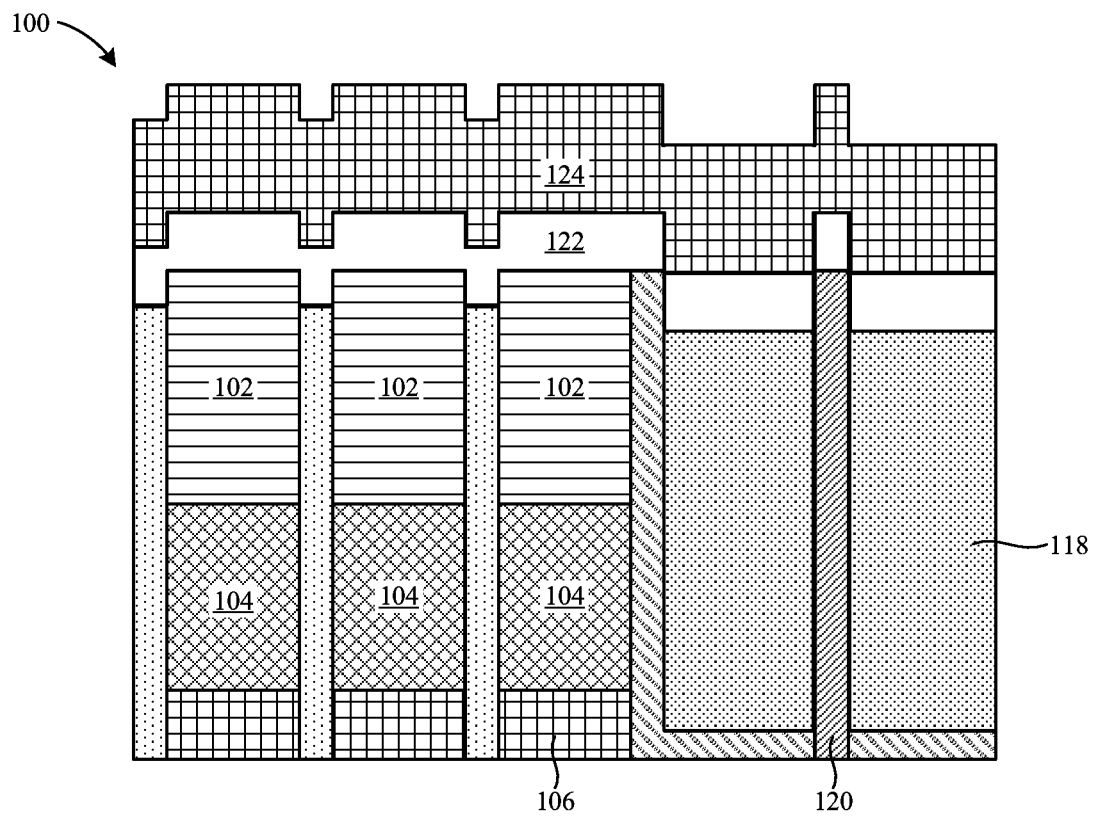

FIG. 1G illustrates the memory device 100 after formation/deposition of (i) a second cap layer 122 over the upper surface of the memory device 100 and (ii) a second metallization layer 124 over the second cap layer 122. In some embodiments, the second cap layer 122 comprises a resistive material, such as a resistive cell film, and is configured as a non-sacrificial layer. In some embodiments, the second cap layer 122 can be formed from one or more materials used to form the memory cells 102 and/or the selectors 104. The second cap layer 122 is configured to protect the memory cells 102 during operation of the memory device 100 and/or during downstream processing steps on the memory device 100. The second metallization layer 124 can comprise a metal such as tungsten, a metal alloy, a conductive-metal containing material, etc. The second metallization layer 124 can be electrically coupled to the conductive via 120 and/or to one or more of the memory cells 102. In some embodiments, the second metallization layer 124 can have a thickness of between about 100-1000 angstroms (e.g., about 550 angstroms). In one aspect of the present technology, the upper surface of the second metallization can have a variable topography (e.g., can be nonplanar) due to the nonplanar surface formed by the memory cells 102, the insulative columns 108, the insulative material 118, and the conductive via 120.

In operation, each of the memory cells 102 can store a bit of data and can be written to (e.g., accessed) by varying a voltage supplied to the corresponding one of the selectors 104 via the first metallization layer 106 and/or the second metallization layer 124. In some embodiments, the memory cells 102 are non-volatile. The conductive via 120 can be used to operably couple the memory device 100 to external devices (e.g., a processor device) and/or to other components (e.g., other memory devices) within an integrated memory package. As one of ordinary skill in the art will appreciate, the memory device 100 can be further "packaged" for protection and to include appropriate electrical interconnections.

FIGS. 2A-2I are enlarged side cross-sectional views illustrating various stages in a method of manufacturing a memory device 200 (e.g., a semiconductor device) in accordance with embodiments of the present technology. Some aspects of the illustrated method can be generally similar or identical to the method described in detail above with reference to FIGS. 1A-1G. For example, the memory device 200 can generally be manufactured as a discrete device or as part of a larger wafer or panel. For ease of explanation and understanding, FIGS. 2A-2I illustrate the fabrication of a portion of a single memory device 200. However, one skilled in the art will readily understand that the fabrication of the memory device 200 can be scaled to the wafer and/or panel level—that is, to include many more components so as to be capable of being singulated into two or more memory devices—while including similar features and using similar processes as described herein.

Figure 2A:
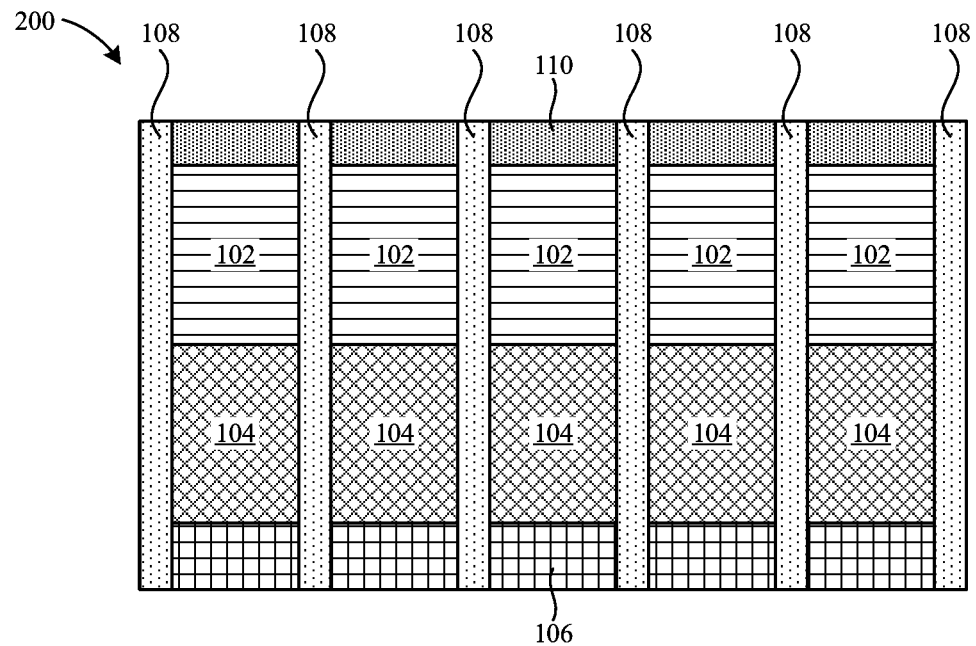
FIGS. 2A-2I are enlarged side cross-sectional views illustrating various stages in a method of manufacturing a memory device in accordance with additional embodiments of the present technology.

FIG. 2A illustrates the memory device 200 at the same stage of manufacturing as shown in FIG. 1A and as described in detail above. That is, for example, FIG. 2A illustrates the memory device 200 after the formation of the memory cells 102, the selectors 104, the first metallization layer 106, the insulative columns 108, and the protection layer 110.

Figure 2B:
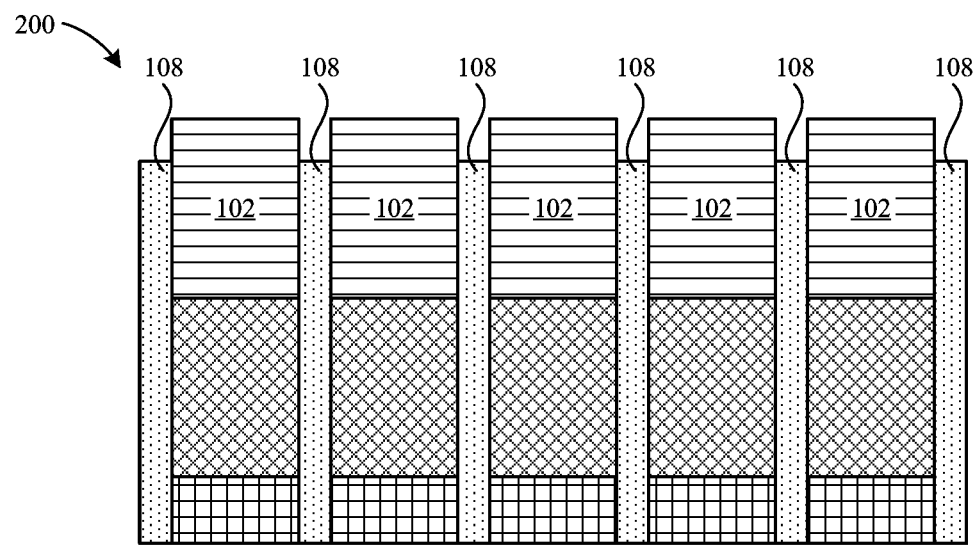

FIG. 2B illustrates the memory device 200 after removal of the protection layer 110 (FIG. 2A). In some embodiments, a wet-etching process can be used to remove the protection layer 110. In some embodiments, the wet-etching or other removal process can also remove a portion of the insulative columns 108 such that the memory cells 102 (e.g., upper portions of the memory cells 102) extend to a higher elevation than the insulative columns 108 (e.g., extend past upper surfaces of the insulative columns 108). In one aspect of the present technology, compared to the method illustrated in FIGS. 1A-1G, the protection layer 110 can be more easily/efficiently removed at this stage before formation of a socket (e.g., the socket 114) in/through the memory device 200. For example, the memory device 200 can have a better cell stack to remove the protection layer 110, thereby allowing a better margin for under polishing and/or over polishing at this stage before formation of a socket. Increasing the margin for removing the protection layer 110 is expected to improve the margin for downstream processing stages.

Figure 2C:
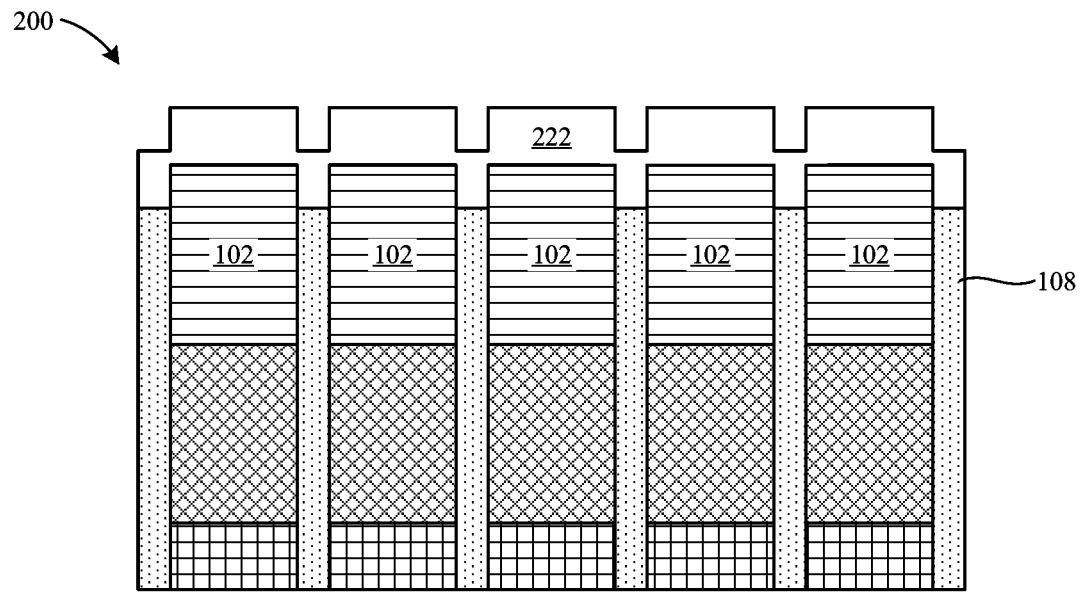

FIG. 2C illustrates the memory device 200 after formation/deposition of a cap layer 222 over the upper surface of the memory device 100 (e.g., over upper surfaces of the memory cells 102 and the insulative columns 108). In some embodiments, the cap layer 222 comprises a resistive material, such as a resistive cell film, and is configured as a non-sacrificial layer. In some embodiments, the second cap layer 122 can be formed from one or more materials used to form the memory cells 102 and/or the selectors 104. The cap layer 222 is configured to protect the memory cells 102 during operation of the memory device 200 and/or during downstream processing steps on the memory device 200. In some embodiments, the cap layer 222 can have a nonplanar upper surface (e.g., opposite a lower surface facing/contacting the memory cells 102) corresponding to the elevation differences between the insulative columns 108 and the memory cells 102. More specifically, the upper surface of the cap layer 222 can have an undulating shape that includes, for example, alternating raised and recessed portions.

Figure 2D:
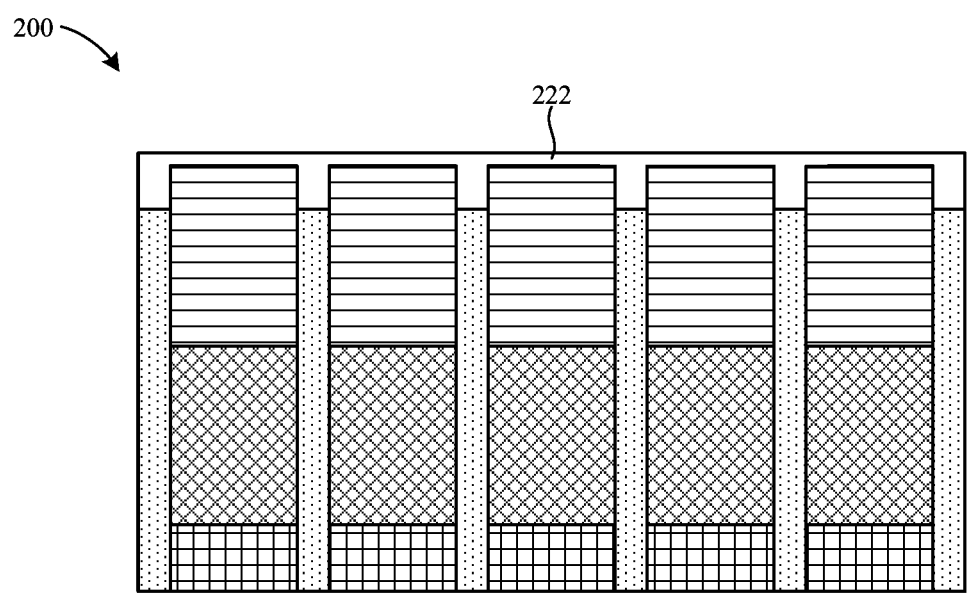

FIG. 2D illustrates the memory device 200 after planarization/polishing of the cap layer 222. In the illustrated embodiment, the cap layer 222 has a generally planar upper surface after planarization. The memory device 200 can be planarized/polished using plasma etching, wet etching, chemical-mechanical planarization (CMP), buffing, and/or other suitable techniques. In a particular embodiment, the memory device 200 is planarized using a buffing process.

Figure 2E:
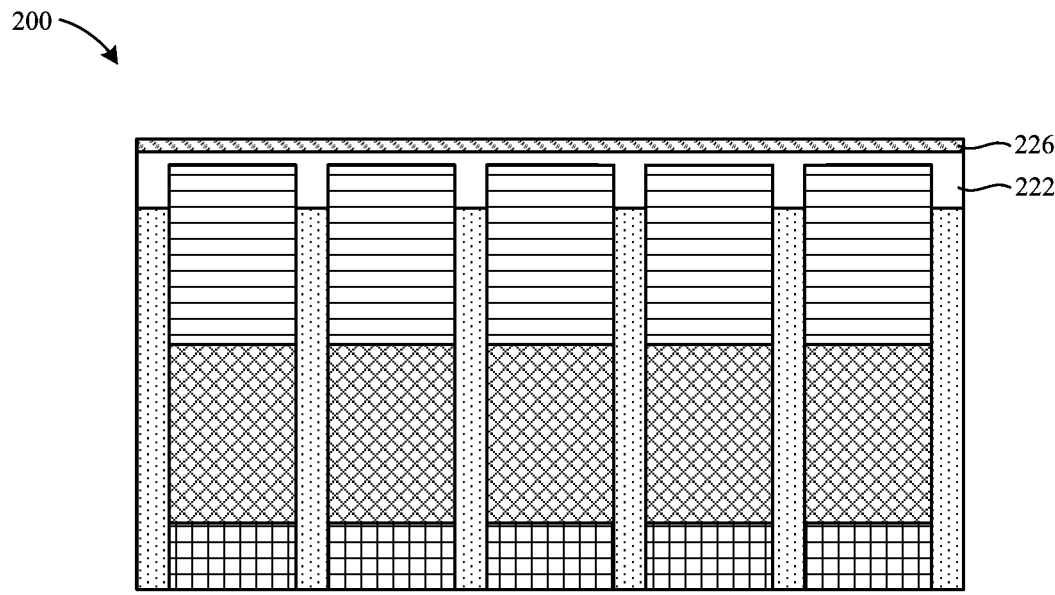

FIG. 2E illustrates the memory device 200 after formation/deposition of an insulative layer 226 over the cap layer 222. In some embodiments, the insulative layer 226 can comprise a nitride material (e.g., silicon nitride) and can have a thickness of between about 10-100 angstroms (e.g., about 60 angstroms).

Figure 2F:
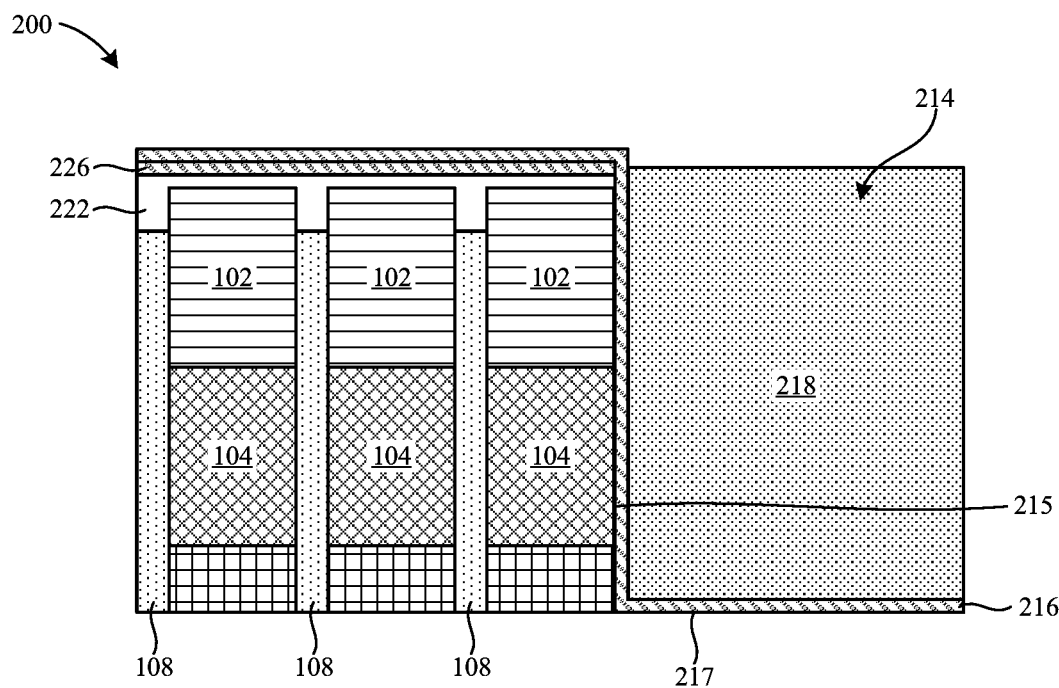

FIG. 2F illustrates the memory device 200 after (i) formation of a socket 214, (ii) formation/deposition of a liner layer 216 in the socket 214, and (iii) formation/deposition of an insulative material 218 in the socket 214. The socket 214 can be formed by removing a portion of the memory device 200—such as one or more of the memory cells 102, the selectors 104, the first metallization layer 106, the insulative columns 108, the cap layer 222, and the insulative layer 226. In some embodiments, the socket 114 can include a generally vertical sidewall 215 formed, in part, by one of the vertically aligned pairs of the memory cells 102 and the selectors 104. The socket 214 can be formed via a mask and etching process, or another suitable removal process. The liner layer 216 can be formed along/over/on (i) a bottom surface 217 of the memory device 100 (which can comprise a portion of a temporary carrier wafer), (ii) the sidewall 215, and (iii) the insulative layer 226 (e.g., over an upper surface of the insulative layer 226). In some embodiments, the liner layer 216 can be formed of a nitride material and can have a thickness of between about 10-100 angstroms (e.g., about 60 angstroms). The insulative material 218 can be a passivation, dielectric, or other suitable insulating material such as, for example, silicon oxide, tetraethyl orthosilicate (TEOS), etc. In a particular embodiment, the insulative material 218 is TEOS.

Figure 2G:
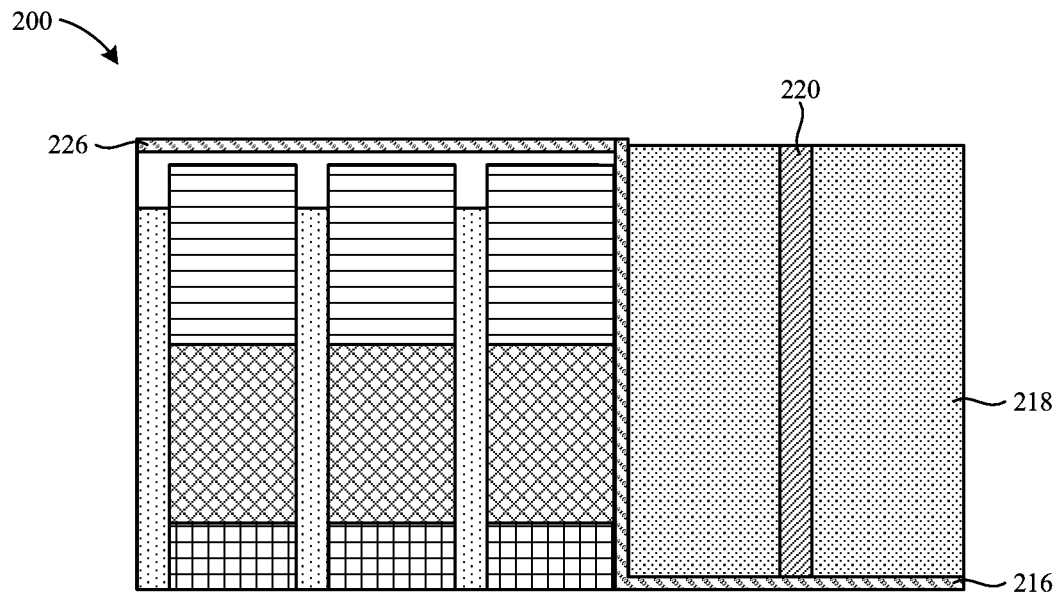

FIG. 2G illustrates the memory device 200 after (i) formation of a conductive via 220 through the insulative material 218 and the liner layer 216 and (ii) planarization/polishing of the upper surface of the memory device 200 to remove any excess material used to form the conductive via 220. In some embodiments, the conductive via 220 is formed by a suitable masking, etching, and deposition process. For example, a photolithography and/or etching process can be used to etch a high-aspect ratio hole through the insulative material 218, and then conductive material can be deposited into the hole to form the conductive via 220 using chemical vapor deposition, physical vapor deposition, atomic layer deposition, spin coating, electroplating, electroless plating, and/or another suitable technique. Although a single conductive via 220 is shown in FIG. 2G, any number of conductive vias (e.g., two or more) can be formed through the socket 214. In some embodiments, planarizing the upper surface of the memory device 200 can remove the portion of the liner layer 216 above/over the insulative layer 226.

Figure 2H:
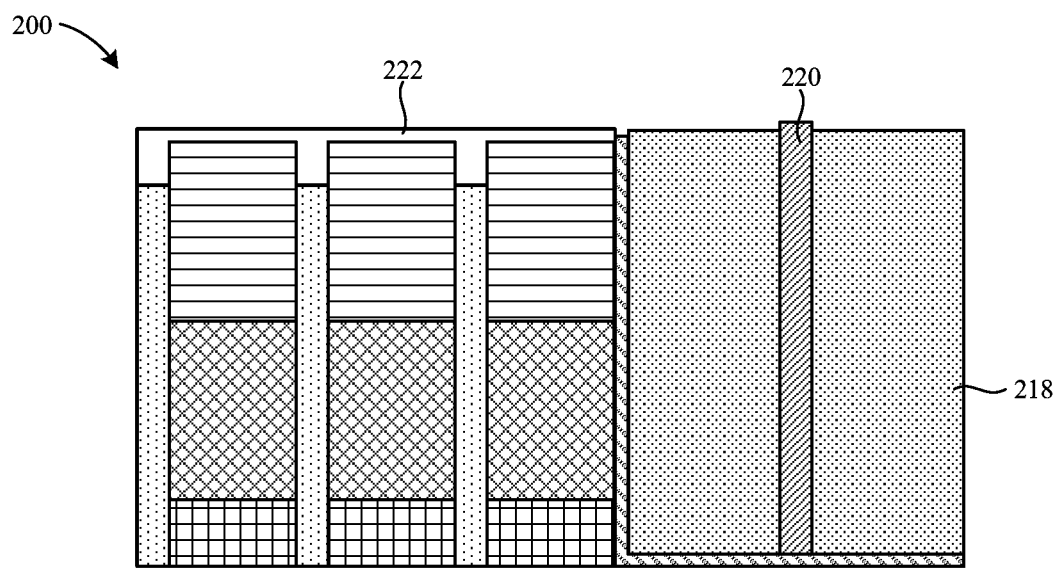

FIG. 2H illustrates the memory device 200 after removal of the insulative layer 226 (FIG. 2G). In some embodiments, a wet-etching process can be used to remove the insulative layer 226. In some embodiments, the wet-etching or other removal process can also remove a portion of the insulative material 218 such that the conductive via 220 (e.g., an upper portion of the conductive via 220) protrudes from the insulative material 218 (e.g., extends past an upper surface of the insulative material 218). In one aspect of the present technology, compared to the method illustrated in FIGS. 1A-1G, the illustrated wet-etching process is expected to remove less of the insulative material 218 such that the conductive via 220 protrudes less from the insulative material 218 than the conductive via 120 protrudes from the insulative material 118 (e.g., as shown in FIG. 1F). More particularly, the wet-etching process used to remove the insulative layer 226 can have a better margin because the protection layer 110 is removed and the cap layer 222 formed before formation of the socket 214. In another aspect of the present technology, the upper surface of the memory device 200 can have a generally planar upper surface (e.g., having a relatively small line width).

Figure 2I:
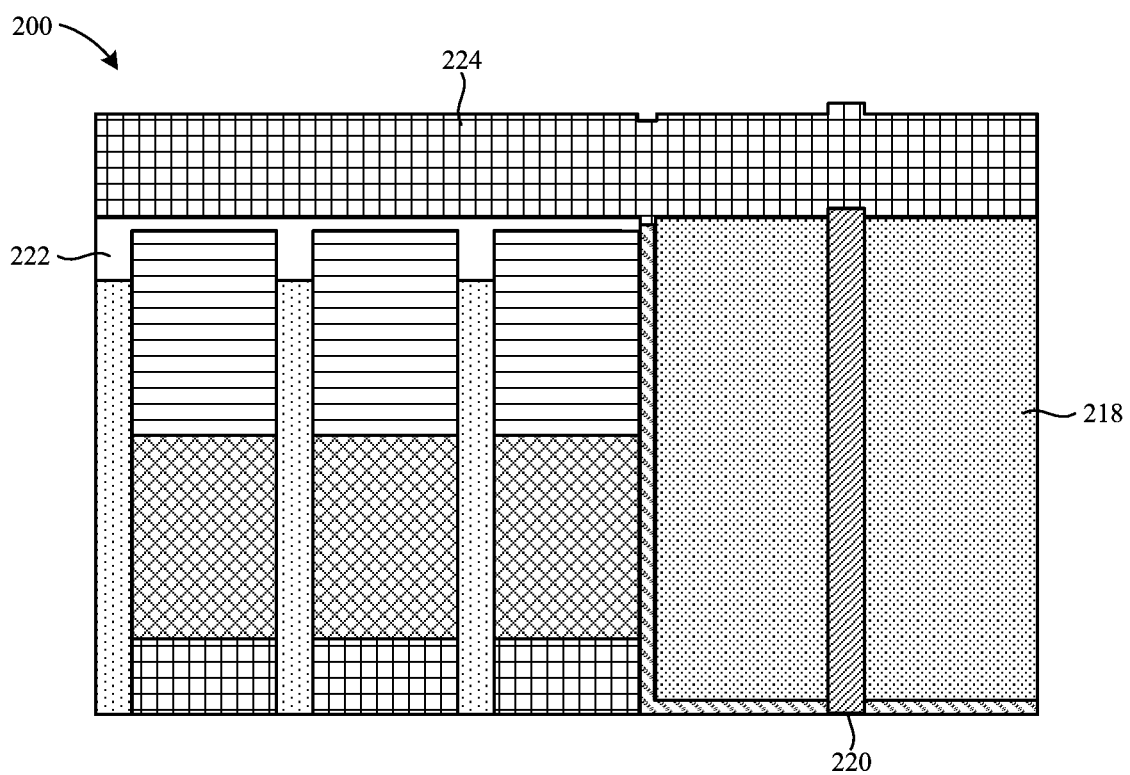

FIG. 2I illustrates the memory device 200 after formation/deposition of a second metallization layer 224 over the cap layer 222, the insulative material 218, and the conductive via 220. The second metallization layer 224 can comprise a metal such as tungsten, a metal alloy, a conductive-metal containing material, etc., and can be electrically coupled to the conductive via 220 and/or one or more of the memory cells 102. In some embodiments, the second metallization layer 224 can have a thickness of between about 100-1000 angstroms (e.g., about 550 angstroms). In one aspect of the present technology, the upper surface of the second metallization layer 224 is generally planar due to the generally planar upper surface formed by the cap layer 222, the insulative material 218, and the conductive via 220. In some embodiments, this can improve the margin for downstream processing steps on the memory device 200. In another aspect of the present technology, the cap layer 222 does not extend over the conductive via 220. Accordingly, the second metallization layer 224 can directly contact the conductive via 220. Compared to the method illustrated in FIGS. 1A-1G, for example, this is expected to reduce the resistance at the conductive via 220 during operation of the memory device 200. Moreover, because the cap layer 222 does not extend over the conductive via 220 and the insulative material 218, additional layers (not shown) can be formed/deposited over the conductive via 220 and/or the insulative material 218.

Figure 3A:
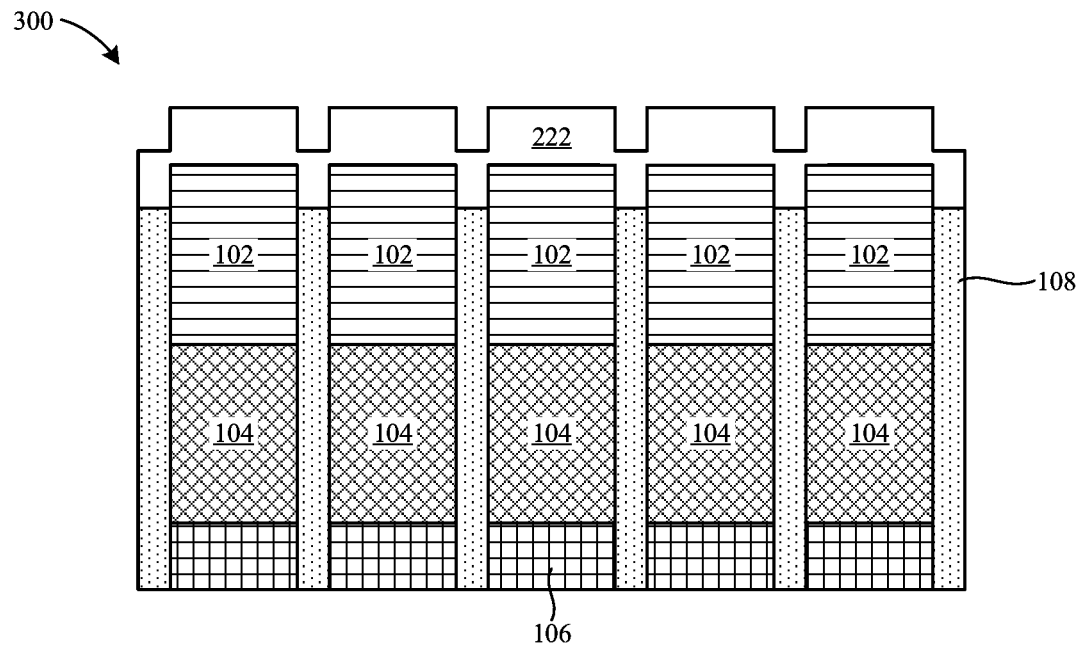
FIGS. 3A-3G are enlarged side cross-sectional views illustrating various stages in a method of manufacturing a memory device in accordance with additional embodiments of the present technology.

FIGS. 3A-3G are enlarged side cross-sectional views illustrating various stages in a method of manufacturing a memory device 300 (e.g., a semiconductor device) in accordance with additional embodiments of the present technology. Some aspects of the illustrated method can be generally similar or identical to the methods described in detail above with reference to FIGS. 1A-2I. For example, FIG. 3A illustrates the memory device 300 at the same stage of manufacturing as shown in FIG. 2C and as described in detail above. That is, FIG. 3A illustrates the memory device 300 after the formation of the memory cells 102, the selectors 104, the first metallization layer 106, the insulative columns 108, and the cap layer 222.

Figure 3B:
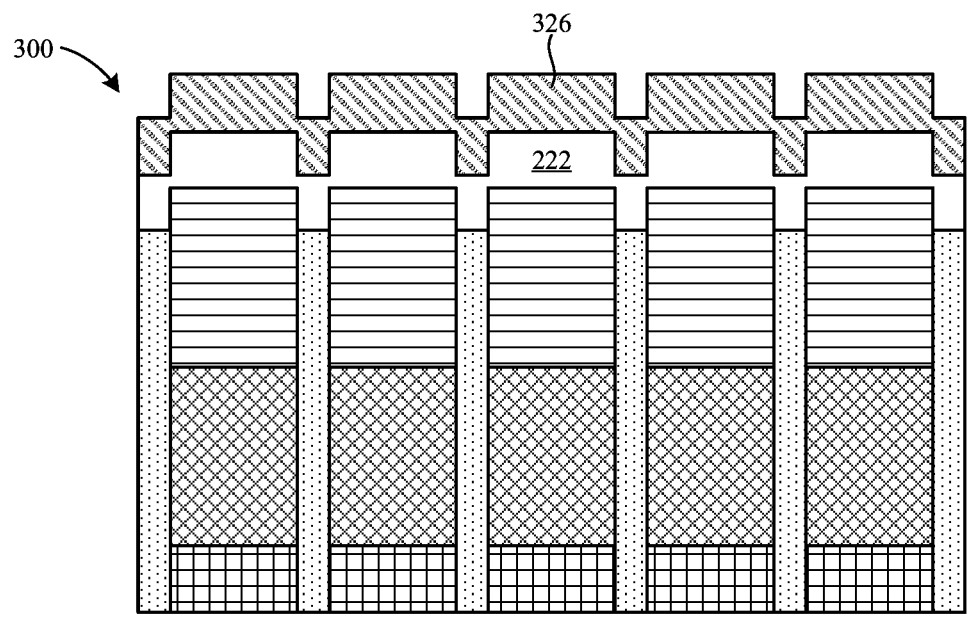

FIG. 3B illustrates the memory device 300 after formation/deposition of an insulative layer 326 over the cap layer 222. In some embodiments, the insulative layer 326 can be formed of a nitride material (e.g., silicon nitride) and can have a thickness of between about 10-100 angstroms (e.g., about 60 angstroms).

Figure 3C:
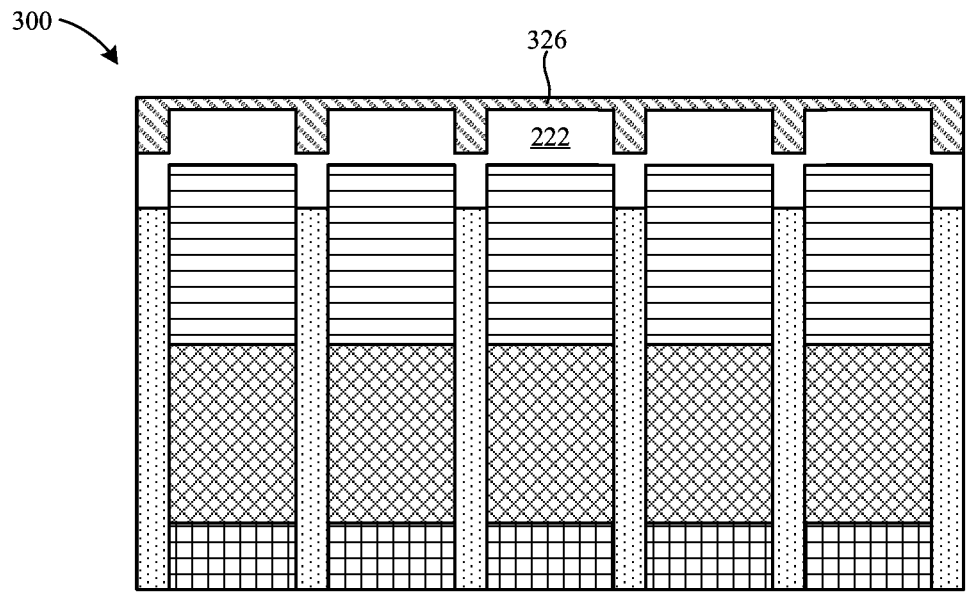

FIG. 3C illustrates the memory device 300 after planarization/polishing of the insulative layer 326. In the illustrated embodiment, the insulative layer 326 has a generally planar upper surface after planarization. The memory device 300 can be planarized/polished using plasma etching, wet etching, chemical-mechanical planarization (CMP), buffing, and/or other suitable techniques. In a particular embodiment, the memory device 300 is planarized using a buffing process.

Figure 3D:
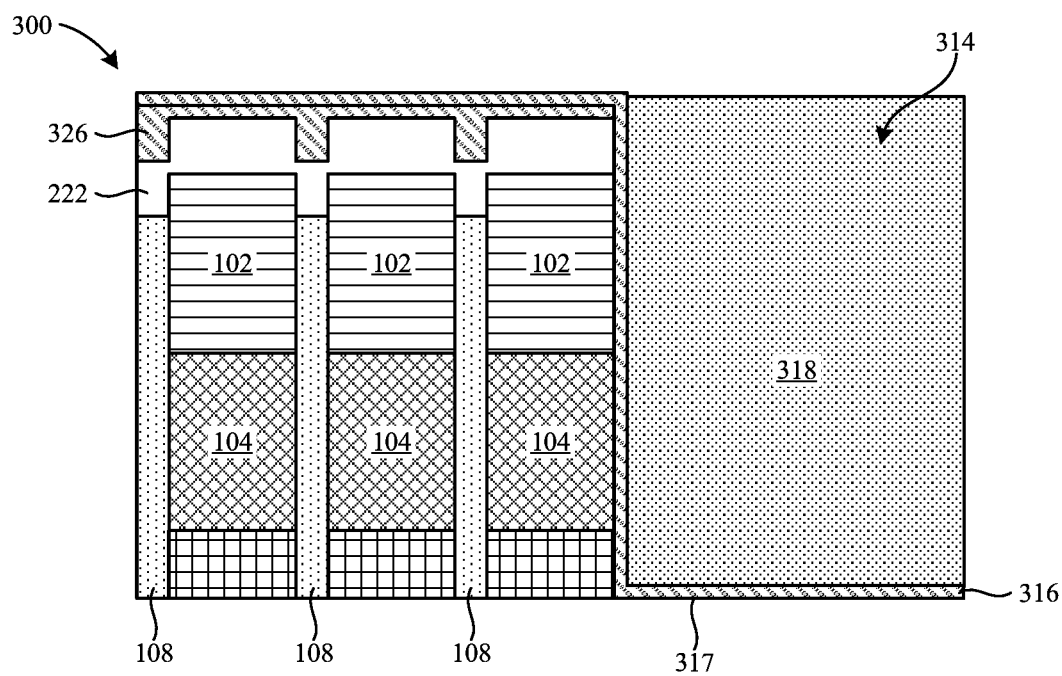

FIG. 3D illustrates the memory device 300 after (i) formation of a socket 314, (ii) formation/deposition of a liner layer 316 in the socket 314, and (iii) formation/deposition of an insulative material 318 in the socket 314. The socket 314 can be formed by removing a portion of the memory device 300—such as one or more of the memory cells 102, the selectors 104, the first metallization layer 106, the insulative columns 108, the cap layer 222, and the insulative layer 326. In some embodiments, the liner layer 316 can be formed of a nitride material and can have a thickness of between about 10-100 angstroms (e.g., about 60 angstroms). The insulative material 318 can be a passivation, dielectric, or other suitable insulating material such as, for example, silicon oxide, tetraethyl orthosilicate (TEOS), etc. In some embodiments, the planarization stage show in FIG. 3C can be incorporated into the removal process used to form the socket 314.

Figure 3E:
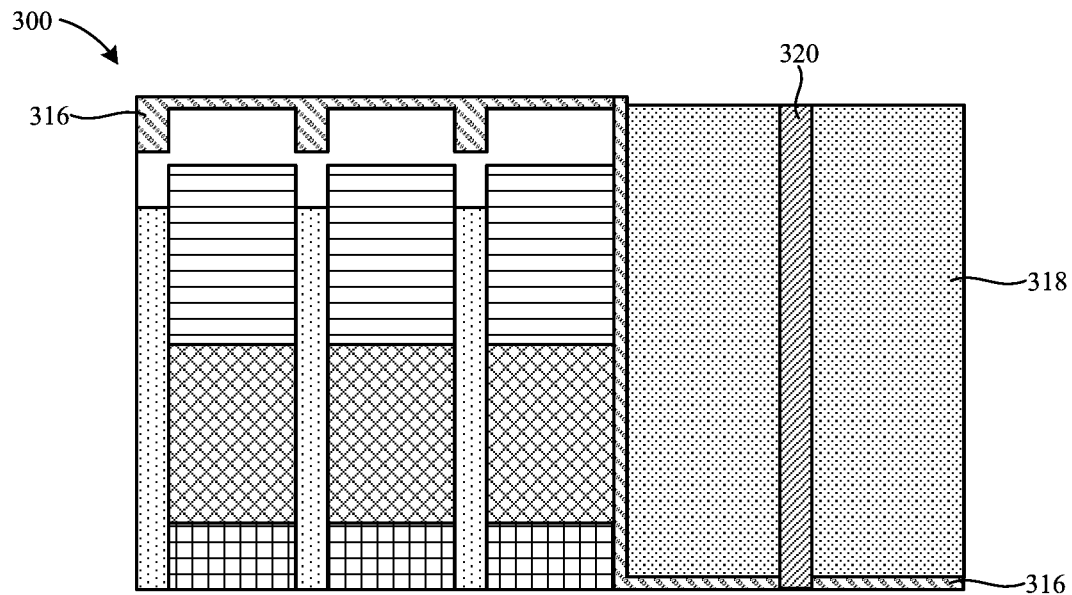

FIG. 3E illustrates the memory device 300 after (i) formation of a conductive via 320 through the insulative material 318 and the liner layer 316 and (ii) planarization/polishing of the upper surface of the memory device 300 to remove any excess material used to form the conductive via 320. In some embodiments, planarizing the upper surface of the memory device 300 can remove the portion of the liner layer 316 above/over the insulative layer 326.

Figure 3F:
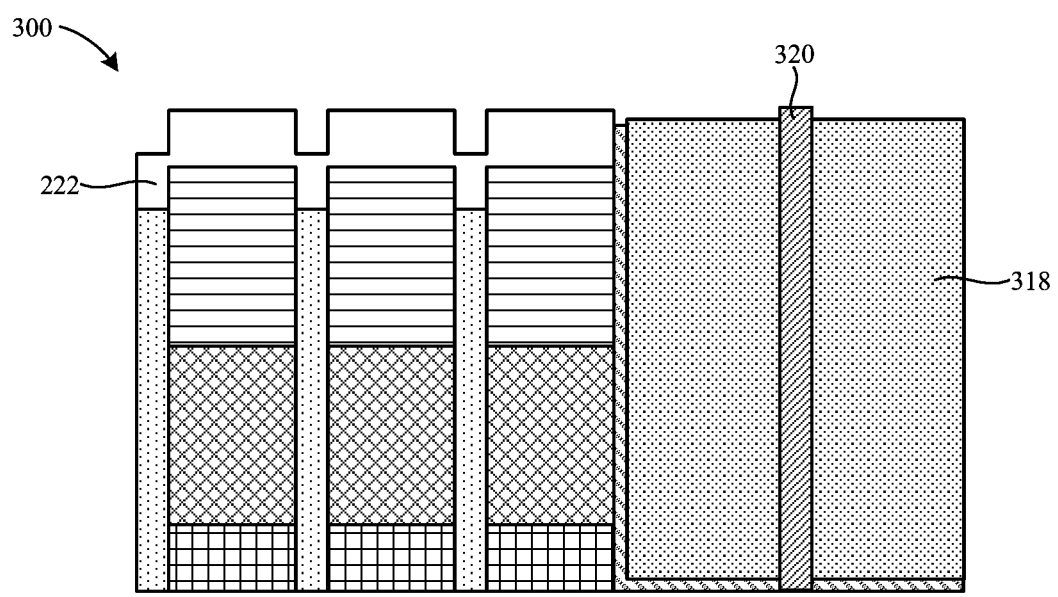

FIG. 3F illustrates the memory device 300 after removal of the insulative layer 326 (FIG. 3E) via, for example, a wet-etching process. In some embodiments, the wet-etching or other removal process can also remove a portion of the insulative material 318 such that the conductive via 320 (e.g., an upper portion of the conductive via 320) protrudes from the insulative material 318 (e.g., extends past an upper surface of the insulative material 318). In one aspect of the present technology, compared to the method illustrated in FIGS. 1A-1G, the illustrated wet-etching process is expected to remove less of the insulative material 318 such that the conductive via 320 protrudes less from the insulative material 318 than the conductive via 120 protrudes from the insulative material 118 (e.g., as shown in FIG. 1F). More particularly, the wet-etching process used to remove the insulative layer 326 can have a better margin because the insulative layer 326 was planarized (FIG. 3C) and thus has a better uniformity. In the illustrated embodiment, the upper surface of the cap layer 222 can have an undulating shape that includes, for example, alternating raised and recessed portions.

Figure 3G:
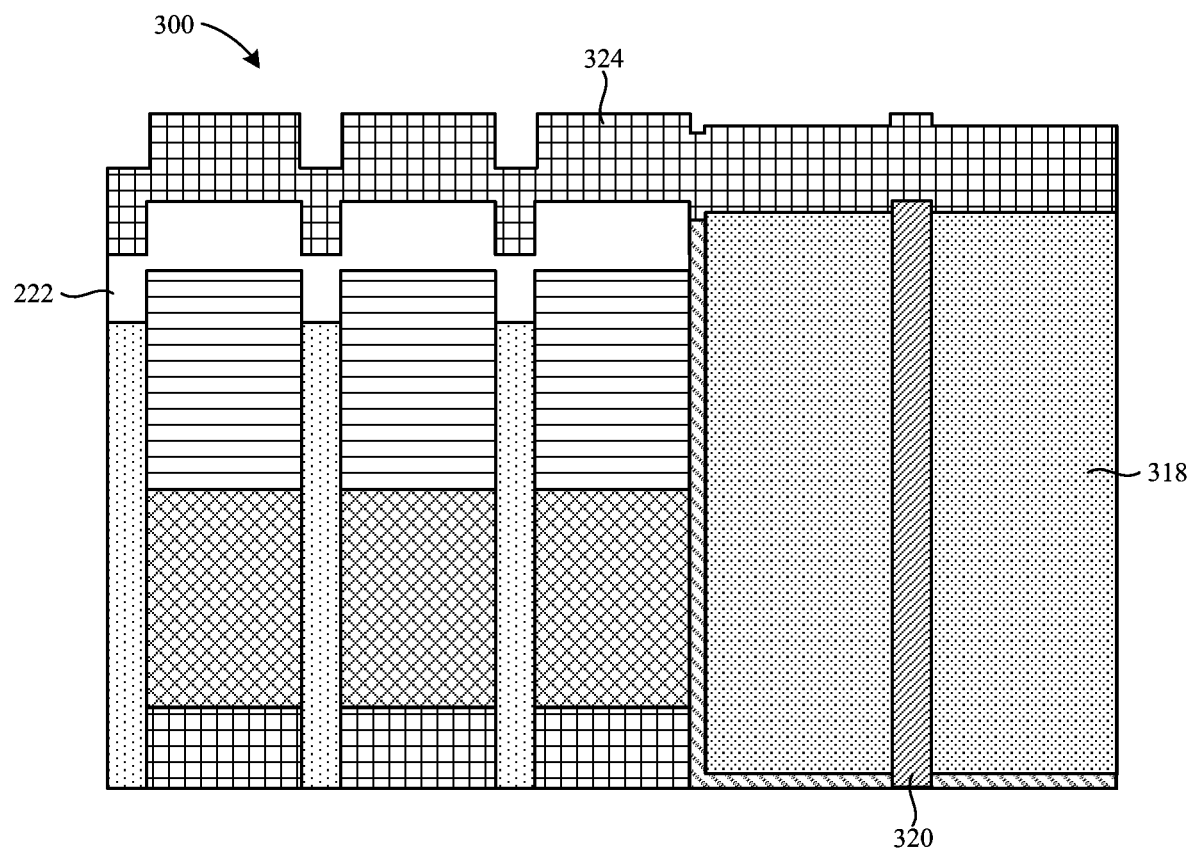

FIG. 3G illustrates the memory device 300 after formation/deposition of a second metallization layer 324 over the cap layer 222, the insulative material 318, and the conductive via 320. The second metallization layer 324 can comprise a metal such as tungsten, a metal alloy, a conductive-metal containing material, etc., and can be electrically coupled to the conductive via 320 and/or one or more of the memory cells 102. In one aspect of the present technology, the cap layer 222 does not extend over the conductive via 320 and can therefore directly contact the conductive via 320 and the insulative material 318. Compared to the method illustrated in FIGS. 1A-1G, for example, this is expected to reduce the resistance at the conductive via 320 during operation of the memory device 300. Moreover, in some embodiments, one or more additional layers can be formed over the insulative material 318 and/or the conductive via 320 before formation of the second metallization layer 324.

Figure 4:
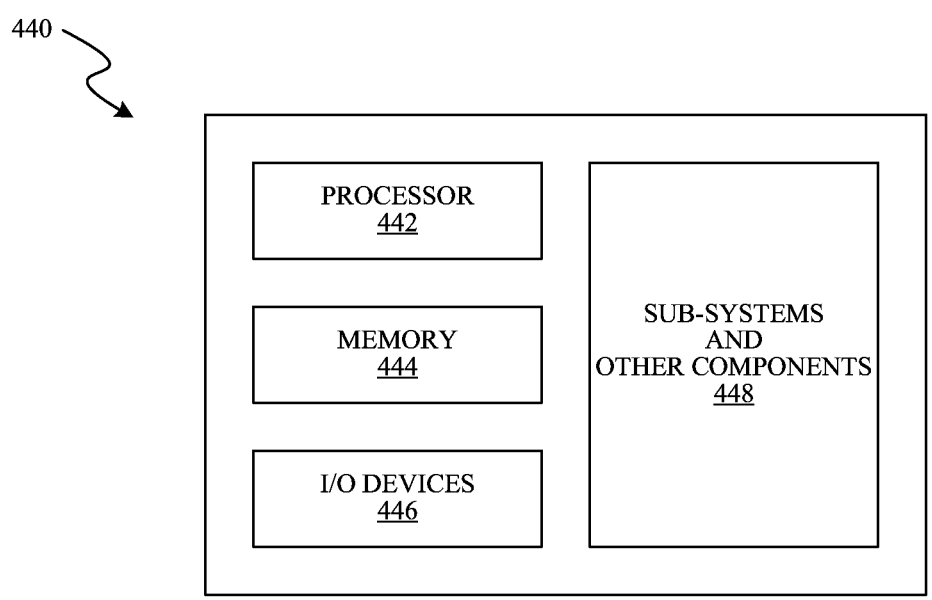
FIG. 4 is a schematic view of a system that includes a memory device in accordance with embodiments of the present technology.

Any one of the memory devices and/or packages having the features described above with reference to FIGS. 1A-3G can be incorporated into any of a myriad of larger and/or more complex systems, a representative example of which is system 4 shown schematically in FIG. 4. The system 440 can include a processor 442, a memory 444 (e.g., SRAM, DRAM, flash, and/or other memory devices), input/output devices 446, and/or other subsystems or components 448. The memory devices and/or packages described above with reference to FIGS. 1A-3G can be included in any of the elements shown in FIG. 4. The resulting system 440 can be configured to perform any of a wide variety of suitable computing, processing, storage, sensing, imaging, and/or other functions. Accordingly, representative examples of the system 440 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 440 include lights, cameras, vehicles, etc. With regard to these and other example, the system 440 can be housed in a single unit or distributed over multiple interconnected units, for example, through a communication network. The components of the system 440 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A memory device, comprising:
   memory cells;
   selectors operably coupled to corresponding ones of the memory cells;
   a socket having an insulative material therein;
   a conductive via extending through the insulative material; and
   a cap layer extending over the memory cells, wherein the cap layer does not extend over the socket.

2. The memory device of claim 1 wherein the cap layer comprises a resistive cell film.

3. The memory device of claim 1 wherein the cap layer includes a lower surface facing the memory cells and an upper surface opposite the lower surface, wherein the upper surface is nonplanar.

4. The memory device of claim 3 wherein the upper surface of the cap layer includes alternating raised and recessed portions.

5. The memory device of claim 1 wherein the cap layer includes a lower surface facing the memory cells and an upper surface opposite the lower surface, wherein the upper surface is generally planar.

6. The memory device of claim 1 wherein the conductive via includes an upper portion that projects past an upper surface of the insulative material.

7. The memory device of claim 1, further comprising:
   a first metallization layer electrically coupled to the selectors; and
   a second metallization layer over the cap layer and electrically coupled to the memory cells.

8. The memory device of claim 1 wherein the memory cells include a chalcogenide material.

9. A memory device, comprising:
   memory cells;
   selectors operably coupled to corresponding ones of the memory cells;
   a socket having an insulative material therein;
   a conductive via extending through the insulative material;
   a cap layer extending over the memory cells; and
   a metallization layer extending over the cap layer and the socket, wherein the metallization layer directly contacts the conductive via.

10. The memory device of claim 9 wherein the metallization layer directly contacts the insulative material in the socket.

11. The memory device of claim 9 wherein the cap layer comprises a resistive material, and wherein the memory cells include a chalcogenide material.

* * * * *